(12) United States Patent
Kutsukake (10) Patent No.: US 9,058,882 B2
(45) Date of Patent: Jun. 16, 2015

(54) NONVOLATILE SEMICONDUCTOR MEMORY DEVICE

(71) Applicant: KABUSHIKI KAISHA TOSHIBA, Minato-ku (JP)

(72) Inventor: Hiroyuki Kutsukake, Kanagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/508,807

(22) Filed: Oct. 7, 2014

(65) Prior Publication Data

US 2015/0023111 A1 Jan. 22, 2015

Related U.S. Application Data

(62) Division of application No. 13/602,738, filed on Sep. 4, 2012, now Pat. No. 8,885,414.

(30) Foreign Application Priority Data

Mar. 21, 2012 (JP) .................. 2012-064541

(51) Int. Cl.
  *G11C 11/34* (2006.01)
  *G11C 16/14* (2006.01)
  *G11C 16/10* (2006.01)
  *G11C 16/30* (2006.01)
  *H01L 27/115* (2006.01)
  *G11C 16/04* (2006.01)
  *G11C 16/16* (2006.01)

(52) U.S. Cl.
  CPC ............... *G11C 16/14* (2013.01); *G11C 16/10* (2013.01); *G11C 16/0483* (2013.01); *G11C 16/16* (2013.01); *G11C 16/30* (2013.01); *H01L 27/11546* (2013.01)

(58) Field of Classification Search
  CPC .... G11C 16/0483; G11C 16/10; G11C 16/16; G11C 16/30
  USPC ............. 365/185.18, 185.05, 185.17, 185.29, 365/185.14
  See application file for complete search history.

(56) References Cited

U.S. PATENT DOCUMENTS

| | | | |
|---|---|---|---|
| 6,049,494 A | 4/2000 | Sakui et al. | |
| 6,411,548 B1 | 6/2002 | Sakui et al. | |
| 6,556,481 B1 * | 4/2003 | Hsu et al. | 365/185.24 |

(Continued)

FOREIGN PATENT DOCUMENTS

| | | |
|---|---|---|
| JP | 2002-245785 | 8/2002 |
| JP | 2009-141222 | 6/2009 |

(Continued)

*Primary Examiner* — Viet Q Nguyen
(74) *Attorney, Agent, or Firm* — Oblon, McClelland, Maier & Neustadt, L.L.P.

(57) ABSTRACT

A nonvolatile semiconductor memory device of an embodiment includes a p-type semiconductor substrate, a first P-well formed in the semiconductor substrate, and on which a plurality of memory cells is formed, an first N-well surrounding the first P-well and electrically separating the first P-well from the semiconductor substrate, a first negative voltage generation unit configured to generate a first negative voltage, a boost unit configured to boost a voltage and generate a boosted voltage, and a well voltage transmission unit connected to the first negative voltage generation unit, the boost unit, and the first P-well, and configured to switch a voltage between the first negative voltage and the boosted voltage, the voltage being applied to the first P-well.

18 Claims, 9 Drawing Sheets

| Wiring \ Status | Read | Write | Erase |
|---|---|---|---|
| SL | 0V | Vdd | floating |
| SGS | Vdd | −1V | floating |
| $WL_1$ (Selected) | 0V | Vpgm−1 | 0V |
| $WL_2$~$WL_n$ (Non-Selected) | Vread | Vpass−1 | 0V |
| SGD | Vdd | Vdd | floating |
| $BL_1$ (Selected) | Vbl | −1V | floating |
| $BL_2$~$BL_m$ (Non-Selected) | Vbl | Vdd−1 | floating |
| Cell Pwell | −1V | −1V | Vera |
| Cell deep Nwell | 0V | 0V | Vera |

(56) References Cited

U.S. PATENT DOCUMENTS

| | | | |
|---|---|---|---|
| 6,614,688 B2 | 9/2003 | Jeong et al. | |
| 6,657,898 B2 * | 12/2003 | Hirano | 365/185.29 |
| 6,690,601 B2 * | 2/2004 | Yeh et al. | 365/185.28 |
| 6,747,901 B2 * | 6/2004 | Hirano | 365/185.29 |
| 6,788,573 B2 * | 9/2004 | Choi | 365/185.05 |
| 7,075,140 B2 * | 7/2006 | Spadea | 257/315 |
| 7,180,789 B2 * | 2/2007 | Umezawa | 365/185.28 |
| 7,233,526 B2 * | 6/2007 | Umezawa | 365/185.27 |
| 7,499,332 B2 | 3/2009 | Crippa et al. | |
| 7,525,844 B2 * | 4/2009 | Edahiro | 365/185.21 |
| 7,768,827 B2 | 8/2010 | Kang | |
| 7,848,141 B2 | 12/2010 | Seong et al. | |
| 8,059,466 B2 | 11/2011 | Lee et al. | |
| 8,098,527 B2 | 1/2012 | Fukuda et al. | |
| 8,305,817 B2 | 11/2012 | Park et al. | |
| 8,625,354 B2 | 1/2014 | Cho et al. | |
| 8,885,414 B2 * | 11/2014 | Kutsukake | 365/185.18 |
| 2011/0176347 A1 | 7/2011 | Hisada et al. | |
| 2011/0310666 A1 | 12/2011 | Milda et al. | |
| 2012/0294093 A1 | 11/2012 | Yang | |
| 2013/0026566 A1 | 1/2013 | Kutsukake et al. | |
| 2013/0163331 A1 | 6/2013 | Yoo et al. | |

FOREIGN PATENT DOCUMENTS

| | | |
|---|---|---|
| JP | 2010-165785 | 7/2010 |
| JP | 2011-519462 | 7/2011 |
| JP | 2011-151150 | 8/2011 |
| JP | 2011-163875 | 8/2011 |
| JP | 2013-30525 | 2/2013 |

* cited by examiner

| Wiring \ Status | Read | Write | Erase |
|---|---|---|---|
| SL | 0V | Vdd | floating |
| SGS | Vdd | 0V | floating |
| $WL_1$ (Selected) | 0V | Vpgm | 0V |
| $WL_2 \sim WL_n$ (Non-Selected) | Vread | Vpass | 0V |
| SGD | Vdd | Vdd | floating |
| $BL_1$ (Selected) | Vbl | 0V | floating |
| $BL_2 \sim BL_m$ (Non-Selected) | Vbl | Vdd | floating |
| Cell Pwell | 0V | 0V | Vera |
| Cell deep Nwell | 0V | 0V | Vera |

FIG.4B

| Wiring \ Status | Read | Write | Erase |
|---|---|---|---|
| SL | 0V | Vdd | floating |
| SGS | Vdd | −1V | floating |
| $WL_1$ (Selected) | 0V | Vpgm−1 | 0V |
| $WL_2 \sim WL_n$ (Non-Selected) | Vread | Vpass−1 | 0V |
| SGD | Vdd | Vdd | floating |
| $BL_1$ (Selected) | Vbl | −1V | floating |
| $BL_2 \sim BL_m$ (Non-Selected) | Vbl | Vdd−1 | floating |
| Cell Pwell | −1V | −1V | Vera |
| Cell deep Nwell | 0V | 0V | Vera |

NONVOLATILE SEMICONDUCTOR MEMORY DEVICE

CROSS-REFERENCE TO RELATED APPLICATION

This application is a divisional of and claims the benefit of priority under 35 U.S.C. §120 from U.S. Ser. No. 13/602,738, filed Sep. 4, 2012, which claims the benefit of priority from Japanese Patent Application No. 2012-064541, filed on Mar. 21, 2012, the entire contents of which are incorporated herein by reference.

FIELD

Embodiments described herein relate generally to a nonvolatile semiconductor memory device.

BACKGROUND

A nonvolatile semiconductor memory device using a semiconductor element such as an EEPROM, an AND-type flash memory, a NOR-type flash memory, and a NAND-type flash memory is widely known. Among them, the NAND-type flash memory has an advantage in high density because each of memory cells shares a source-drain diffusion layer.

A word line switch unit is provided at an edge portion of a memory cell array of the NAND-type flash memory, in which a word line switch transistor that transfers a voltage to a word line of the memory cells is formed. To reduce the area of the word line switch unit, it is desired to reduce a write voltage (program voltage) during a data write operation, and to downsize a transistor.

DETAILED DESCRIPTION

A nonvolatile semiconductor memory device of an embodiment includes: a p-type semiconductor substrate; a first P-well formed in the semiconductor substrate, and on which a plurality of memory cells is formed; an first N-well surrounding the first P-well and electrically separating the first P-well from the semiconductor substrate; a first negative voltage generation unit configured to generate a negative voltage; a boost unit configured to boost a voltage and generate a boosted voltage; and a well voltage transmission unit connected to the first negative voltage generation unit, the boost unit, and the first P-well, and configured to switch a voltage between the negative voltage generated in the first negative voltage generation unit and the boosted voltage generated in the boost unit, the voltage being applied to the first P-well.

(First Embodiment)

The nonvolatile semiconductor memory device of the present embodiment includes a p-type semiconductor substrate, a p-type first P-well formed in the semiconductor substrate, and on which a plurality of memory cells is formed, and an n-type first N-well that surrounds the first P-well and electrically separates the first P-well from the semiconductor substrate. Further, a first negative voltage generation unit that generates a negative voltage, and a boost unit that boosts a voltage, and generates a boosted voltage are provided. Furthermore, a well voltage transmission unit that is connected to the negative voltage generation unit, the boost unit, and the first P-well, and switches a voltage between the negative voltage generated in the first negative voltage generation unit and the boosted voltage generated in the boost unit, the voltage being applied to the first P-well, is provided. Note that the nonvolatile semiconductor memory device of the present embodiment is a NAND-type flash memory.

In the nonvolatile semiconductor memory device of the present embodiment, a positive voltage is applied to the first P-well during a data erase operation of the memory cells, while a negative voltage is applied to the first P-well during data read and write operations of the memory cells.

The nonvolatile semiconductor memory device of the present embodiment is capable of providing a negative potential to a P-well on which a plurality of memory cells is formed. Therefore, reduction of a write voltage (Vpgm) during the data write operation to the memory cells becomes possible. Therefore, downsizing of a transistor of a word line switch unit becomes possible, the write voltage (Vpgm) being applied to a source-drain of the transistor. Accordingly, the area of the word line switch unit can be reduced, and the chip area of the nonvolatile semiconductor memory device can be reduced.

Figure 1:
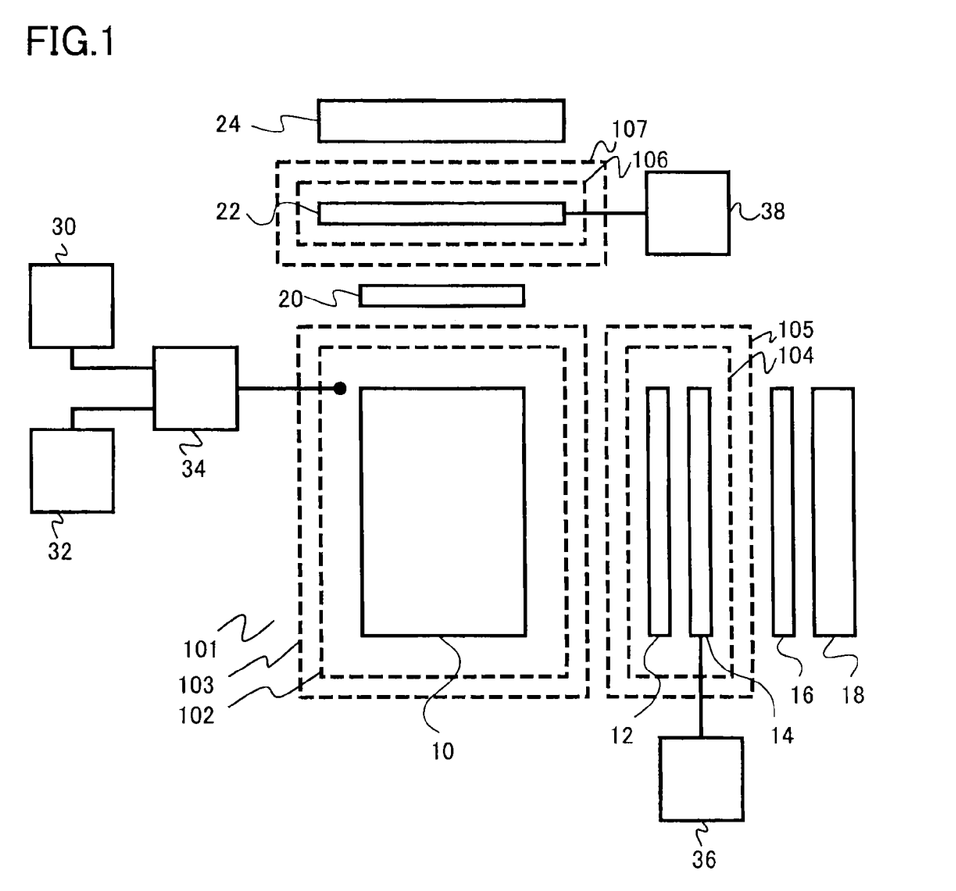
FIG. 1 is a block diagram of a nonvolatile semiconductor memory device according to a first embodiment.

FIG. 1 is a block diagram of the nonvolatile semiconductor memory device according to the present embodiment. As shown in FIG. 1, the nonvolatile semiconductor memory device of the present embodiment includes a memory cell array (memory cell unit) 10 including a plurality of memory cells, a bit line connection unit 12, a bit line switch unit 14, a sense amplifier unit 16, a column decoder unit 18, a word line switch unit 20, a select gate switch unit 22, and a row decoder unit 24.

Figure 2:
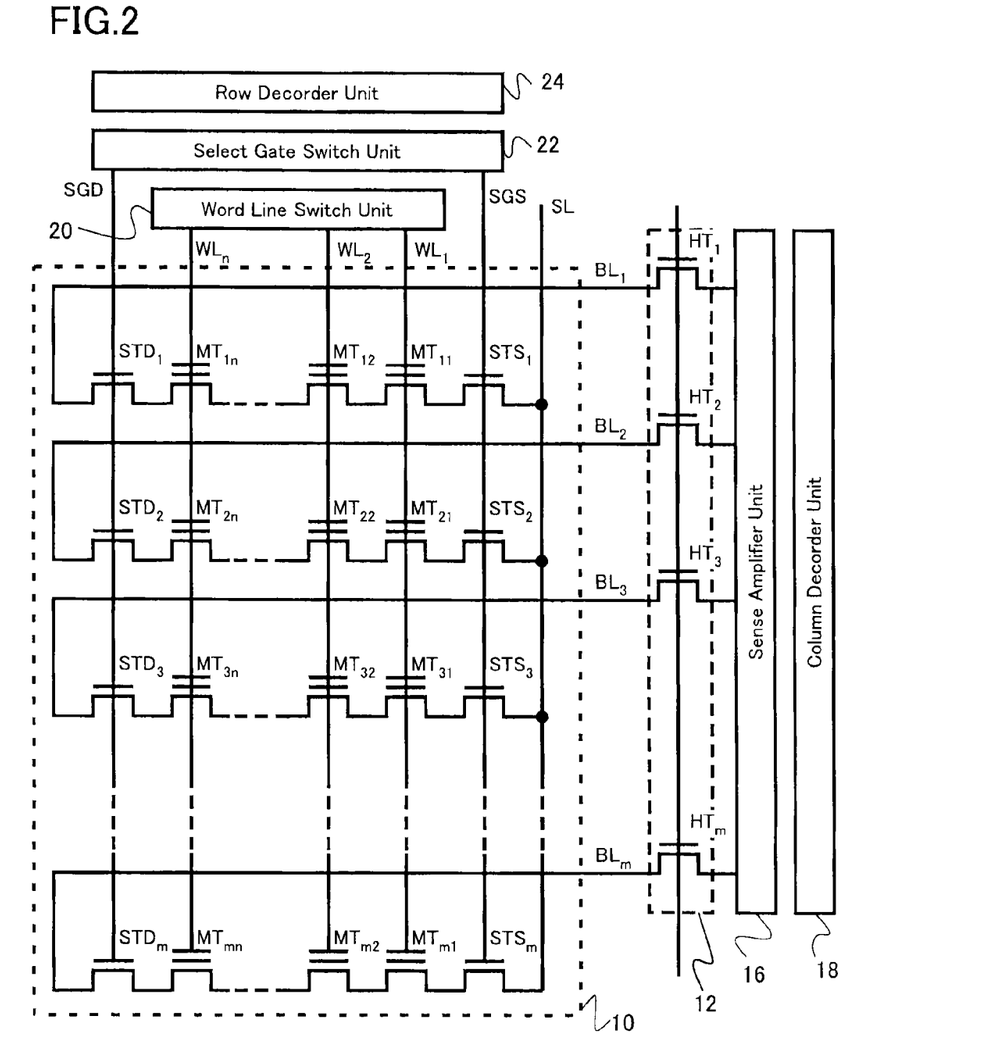
FIG. 2 is a circuit diagram of the nonvolatile semiconductor memory device according to the first embodiment.

FIG. 2 is a circuit diagram of the nonvolatile semiconductor memory device according to the present embodiment. As shown in FIG. 2, the memory cell array 10 is configured from, for example, memory cell transistors $MT_{11}$ to $MT_{1n}$, $MT_{21}$ to $MT_{2n}$, ..., and $MT_{m1}$ to $MT_{mn}$ that are m×n (m and n are integers) transistors having a floating gate structure. In the memory cell array 10, a plurality of memory cell transistors is arranged in a matrix by arraying the memory cell transistors in the row and column directions.

In the memory cell array 10, the memory cell transistors $MT_{11}$ to $MT_{1n}$ and select gate transistors $STS_1$ and $STD_1$ are connected in series to constitute a NAND string as a cell unit, for example.

A drain region of the select gate transistor $STS_1$ that selects the memory cell transistors $MT_{11}$ to $MT_{1n}$ is connected to a source region of the memory cell transistor $MT_{11}$ positioned at an edge portion of the arrangement of the series-connected group of the memory cell transistors $MT_{11}$ to $MT_{1n}$. Also, a source region of the select gate transistor $STD_1$ that selects the memory cell transistors $MT_{11}$ to $MT_{1n}$ is connected to a drain region of the memory cell transistor $MT_{1n}$ positioned at an edge portion of the arrangement of the series-connected group of the memory cell transistors $MT_{11}$ to $MT_{1n}$.

Select gate transistors $STS_2$ to $STS_m$, the memory cell transistors $MT_{21}$ to $MT_{2n}$, ..., and $MT_{m1}$ to $MT_{mn}$, and select gate transistors $STD_2$ to $STD_m$ are connected in series in a similar manner to constitute NAND strings.

A common source line SL is connected to sources of the select gate transistors $STS_1$ to $STS_m$.

Each of word lines $WL_1$ to $WL_n$ of the memory cell transistors $MT_{11}$, $MT_{21}$, ..., and $MT_{m1}$, the memory cell transistors $MT_{12}$, $MT_{22}$, ..., and $MT_{m2}$, and the memory cell transistors $MT_{1n}$, $MT_{2n}$, ..., and $MT_{mn}$ is connected to a word line switch transistor of the word line switch unit 20.

Each of the word lines $WL_1$ to $WL_n$ is connected to a boost circuit and the like via the word line switch unit 20. Accordingly, an operating voltage to be applied to a gate electrode of the word lines $WL_1$ to $WL_n$ is controlled by the word line switch unit 20.

A common select gate line SGS of the select gate transistors $STS_1$ to $STS_m$ and a common select gate line SGD of the select gate transistors $STD_1$ to $STD_m$ are connected to a transistor of the select gate switch unit 22. An operating voltage to be applied to a gate electrode of the select gate transistors $STS_1$ to $STS_m$ is controlled by the select gate switch unit 22.

Further, the word lines $WL_1$ to $WL_n$, and the select gate lines SGS and SGD are connected to the row decoder unit 24 via the word line switch unit 20, and the select gate switch unit 22, respectively. The row decoder unit 24 decodes a row address signal to obtain a row address decoded signal, and controls a gate voltage of the transistors of the word line switch unit 20 and the select gate switch unit 22.

Bit lines $BL_1$ to $BL_m$ are respectively connected to drains of the select gate transistors $STD_1$ to $STD_m$. The column decoder unit 18 obtains a column address signal, and selects one of the bit lines $BL_1$ to $BL_m$ based on a column address decoded signal.

The sense amplifier unit 16 amplifies data read from the memory cell transistors selected by the row decoder unit 24 and the column decoder unit 18 via the bit lines $BL_1$ to $BL_m$.

Further, the bit line connection unit 12 is provided between the memory cell array 10 and the sense amplifier unit 16. Bit line connection transistors $HT_1$ to $HT_m$ that control the status of connection and non-connection between the bit lines $BL_1$ to $BL_m$ and the sense amplifier unit are disposed in the bit line connection unit 12. The respective bit lines $BL_1$ to $BL_m$ are connected to the bit line connection transistors $HT_1$ to $HT_m$.

The bit line connection unit 12 is provided to avoid a high erase voltage being applied to the transistor of the sense amplifier unit 16 during an erase operation of the memory cells where the high erase voltage is applied to the bit line.

Further, as shown in FIG. 1, the nonvolatile semiconductor memory device of the present embodiment includes a p-type semiconductor substrate 101, a p-type first P-well 102 on which the memory cell array 10 including a plurality of memory cells is formed, an n-type first N-well 103 that surrounds the first P-well 102, and electrically separates the first P-well 102 from the semiconductor substrate 101. Further, a first negative voltage generation unit 30 that generates a negative voltage, a boost unit 32 that boosts a voltage, and generates a boosted voltage, and a well voltage transmission unit 34 that is electrically connected to the first negative voltage generation unit 30, the boost unit 32, and the first P-well 102, and causes a voltage to be switched between the negative voltage generated in the first negative voltage generation unit 30 and the boosted voltage generated in the boost unit 32, the voltage being applied to the first P-well 102 are provided.

The first negative voltage generation unit 30 is, for example, configured from a charge pump circuit.

Further, a p-type second P-well 104 formed in the semiconductor substrate 101, and on which the bit line connection unit 12 including the bit line connection transistors for connecting the bit lines of the memory cells and the sense amplifier unit 16 is formed, and an n-type second N-well 105 that surrounds the second P-well 104, and electrically separates the second P-well 104 from the semiconductor substrate 101 are provided.

Further, a second negative voltage generation unit 36 that generates a negative voltage to be applied to the bit line of the memory cells is provided. The negative voltage generated in the second negative voltage generation unit 36 is transferred to the bit lines by a circuit provided in the bit line switch unit 14. The bit line switch unit 14 is also formed on the p-type second P-well 104.

Further, a p-type third P-well 106 on which the select gate switch unit 22 including the select gate transistor that selects the memory cells is formed, and an n-type third N-well 107 that surrounds the third P-well 106, and electrically separates the third P-well 106 from the semiconductor substrate 101 are provided. Further, a third negative voltage generation unit 38 that generates a negative voltage to be applied to the gate electrode of the select gate transistor is provided. The negative voltage generated in the third negative voltage generation unit 38 is transferred to the select gate transistor by the select gate switch unit 22.

The second negative voltage generation unit 36 and the third negative voltage generation unit 38 are, for example, configured from a charge pump circuit.

Figure 3:
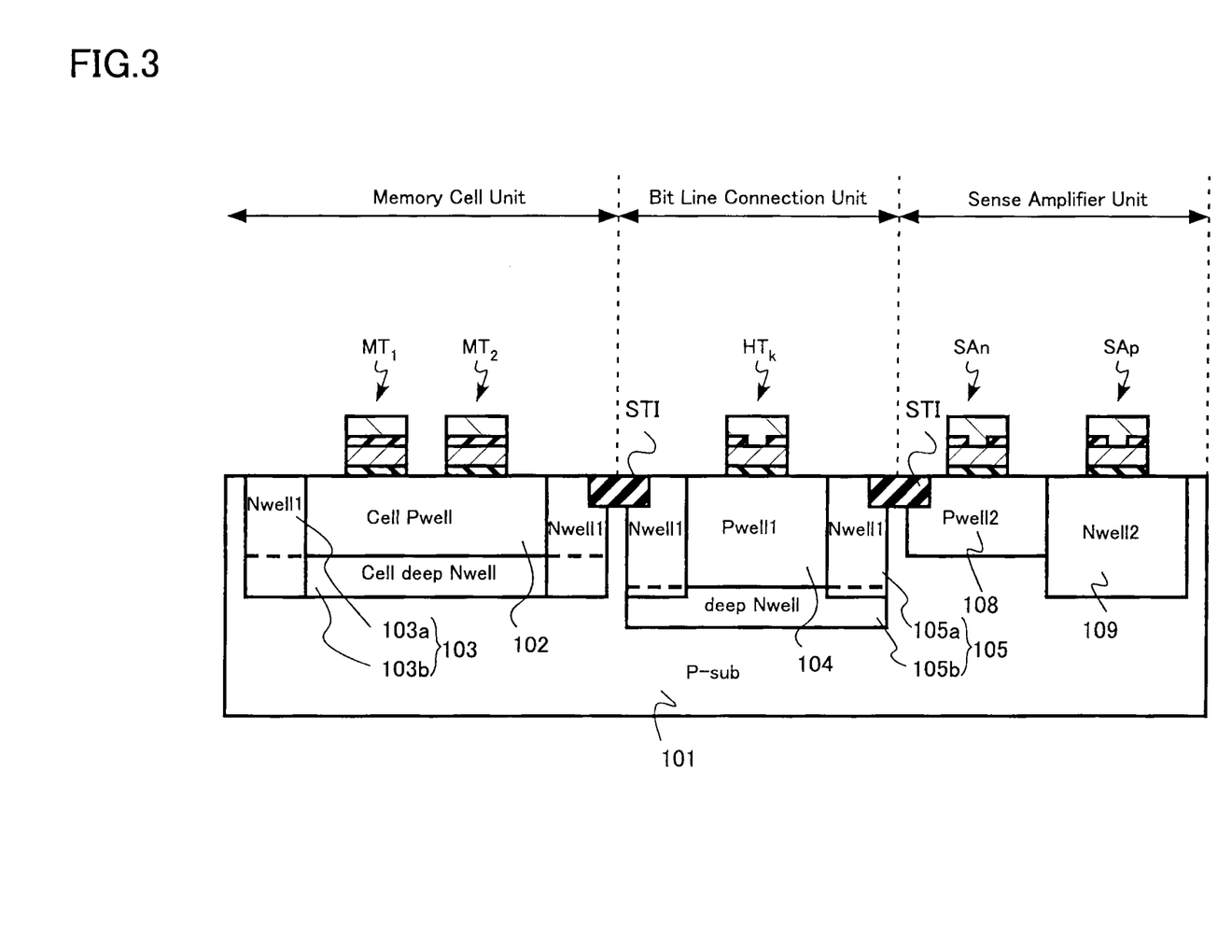
FIG. 3 is a schematic sectional view of the nonvolatile semiconductor memory device according to the first embodiment.

FIG. 3 is a schematic sectional view of the nonvolatile semiconductor memory device according to the present embodiment. FIG. 3 is a cross-section in the vertical direction with respect to an extending direction of the word lines.

As shown in FIG. 3, the nonvolatile semiconductor memory device is formed using the p-type semiconductor substrate (P-sub) 101. An impurity of the semiconductor substrate 101 is, for example, boron (B), and the impurity concentration is, for example, 1E14 to 1E16 atoms/$cm^3$.

Further, the p-type first P-well (cell P-well) 102 is formed in the p-type semiconductor substrate 101. The memory cell transistors $MT_1$ and $MT_2$, and the like are formed on the first P-well 102. That is, the memory cell array including a plurality of memory cells is formed on the first P-well 102.

The impurity of the first P-well 102 is, for example, boron (B), and the impurity concentration is, for example, 5E16 to 1E18 atoms/$cm^3$. Note that, in a case where there is a distribution of the impurity concentration of a well in the present specification, simple description of "the impurity concentration of a well" means a peak concentration of the well.

Further, the first N-well 103 that surrounds the first P-well 102, and electrically separates the first P-well 102 from the semiconductor substrate 101 is formed. The first N-well 103 is configured from a side region (N-well 1) 103a and a bottom region (cell deep N-well) 103b.

The impurity of the first N-well 103 is, for example, phosphorus (P) or arsenic (As), and the impurity concentration is, for example, 5E17 to 1E18 atoms/cm$^3$ for the side region (N-well 1) 103a and 5E16 to 1E17 atoms/cm$^3$ for the bottom region (cell deep N-well) 103b.

As described above, the memory cell unit is formed in a dual-well configured from the first P-well 102 and the first N-well 103.

Further, the p-type second P-well (P-well 1) 104 is formed in a region of the p-type semiconductor substrate (P-sub) 101, the region being corresponding to the bit line connection unit. A bit line connection transistor $HT_k$ that connects the bit line of the memory cells and the sense amplifier unit is formed on the second P-well 104. The impurity of the second P-well 104 is, for example, boron (B), and the impurity concentration is, for example, 5E16 to 1E18 atoms/cm$^3$.

Further, the n-type second N-well 105 that surrounds the second P-well 104, and electrically separates the second P-well 104 from the semiconductor substrate 101 is formed. The second N-well 105 is configured from a side region (N-well 1) 105a and a bottom region (deep N-well) 105b.

The impurity of the second N-well 105 is, for example, phosphorus (P) or arsenic (As), and the impurity concentration is, for example, 5E17 to 1E18 atoms/cm$^3$ for the side region (N-well 1) 105a, and 5E16 to 1E17 atoms/cm$^3$ for the bottom region (deep N-well) 105b.

As described above, the bit line connection unit is formed in a dual-well configured from the second P-well 104 and the second N-well 105.

Further, a p-type fourth P-well (P-well 2) 108 is formed away from the second P-well 104, and in a region of the semiconductor substrate 101, the region being corresponding to the sense amplifier unit. An n-type transistor SAn of the sense amplifier is formed on the fourth P-well 108. The impurity of the fourth P-well 108 is, for example, boron (B), and the impurity concentration is, for example, 5E16 to 1E18 atoms/cm$^3$.

Further, an n-type fourth N-well (N-well 2) 109 is formed in a region of the semiconductor substrate 101, the region being corresponding to the sense amplifier unit. A p-type transistor SAp of the sense amplifier is formed on the fourth N-well 109. The impurity of the fourth N-well 109 is, for example, phosphorus (P) or arsenic (As), and the impurity concentration is, for example, 5E17 to 1E18 atoms/cm$^3$.

The p-type semiconductor substrate 101 is, for example, a silicon substrate. A gate insulating film of the memory cell transistor is, for example, a silicon oxide film. The gate electrode (word line) has a layered structure, and is formed of a charge storage film of polycrystal silicon, for example, of a block insulating film made of a layered film including a silicon oxide film, a silicon nitride film, and a silicon oxide film, for example, or of a control gate electrode film that is a layered film of polycrystal silicon and nickel silicide, for example.

The materials for the semiconductor substrate 101, the gate insulating film, and the gate electrode are not necessarily limited to the illustrated materials. For example, a layered film of polycrystal silicon and cobalt silicide, a layered film of polycrystal silicon and tungsten silicide, a layered film of polycrystal silicon and nickel silicide, a tungsten film, a tungsten nitride film, or other material can be applied as the control gate electrode film.

The bit line connection transistors or the transistor of the sense amplifier includes a layered structure that is similar to the word lines of the memory cells, for example. The transistor is formed of the charge storage film of polycrystal silicon, for example, of the block insulating film made of a layered film including a silicon oxide film, a silicon nitride film, and a silicon oxide film, for example, or of the control gate electrode film that is a layered film of polycrystal silicon and nickel silicide, and is conductively connected to a charge storage film through an opening provided in the block insulating film, for example.

Next, a potential relation during an operation of memory cell data of the nonvolatile semiconductor memory device according to the present embodiment will be described.

The nonvolatile semiconductor memory device of the present embodiment, as shown in FIG. 1, includes the first negative voltage generation unit 30 that generates a negative voltage, the boost unit 32 that boosts a voltage, and generates a boosted voltage, and the well voltage transmission unit 34 that is connected to the first negative voltage generation unit 30, the boost unit 32, and the first P-well 102, and causes a voltage to be switched between the negative voltage generated in the first negative voltage generation unit 30 and the boosted voltage generated in the boost unit 32, the voltage being applied to the first P-well 102.

Further, the memory cells are formed in a dual-well configured from the first P-well 102 and the first N-well 103.

Therefore, a positive voltage (boosted voltage) generated in the boost unit 32, that is, a positive erase voltage (Vera) can be applied to the first P-well 102 during the data erase operation of the memory cells, and a negative voltage can be applied to the first P-well during the data write and read operations of the memory cells.

Figure 4A:
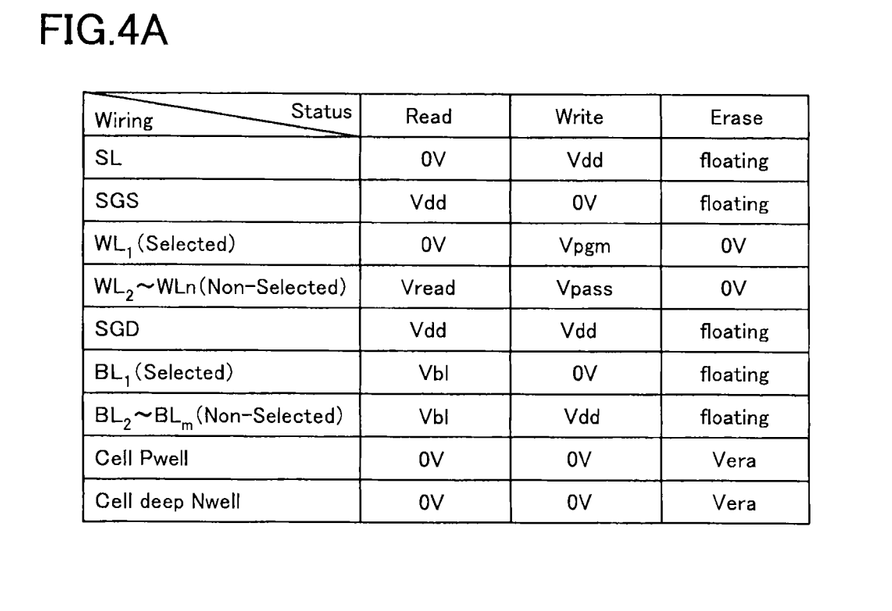
FIGS. 4A and 4B are diagrams showing operating voltages of the nonvolatile semiconductor memory device according to the first embodiment.
Figure 4B:
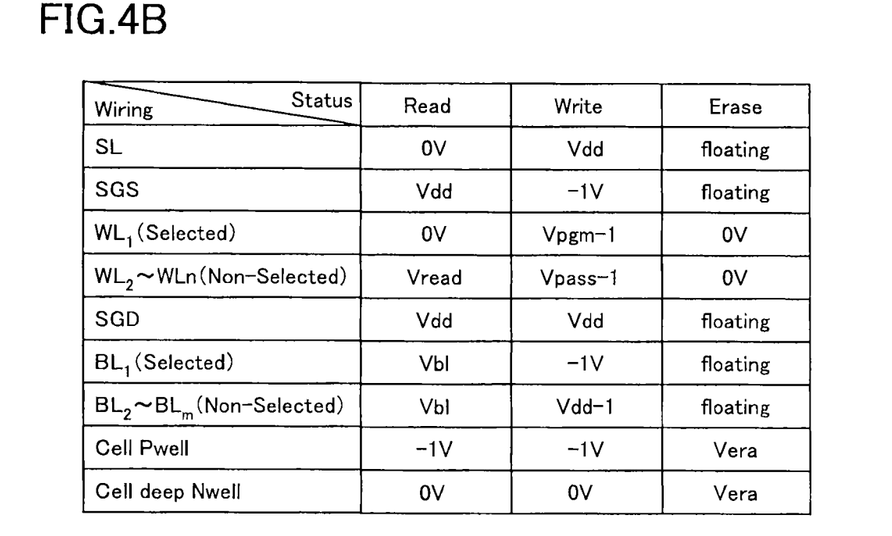

FIGS. 4A and 4B are diagrams showing operating voltages of the nonvolatile semiconductor memory device according the present embodiment. FIG. 4A shows a case where a voltage of 0 V is applied to the first P-well (cell P-well) 102 during the read and write operations, and FIG. 4B shows a case where a negative voltage, for example, a voltage of −1 V is applied to the first P-well 102 during the read and write operations like the present embodiment.

Here, in FIG. 4A, Vdd represents a power supply voltage, and is, for example, 1 to 4 V. Vpgm represents a write voltage, and is, for example, 13 to 26 V. Vread represents a read voltage higher than Vdd, and is, for example, 2 to 9 V. Vpass represents an intermediate voltage, and is, for example, 3 to 13 V. Vb1 is a precharge voltage, and is, for example, 0.5 to 1 V. Also, Vera is an erase voltage, and is, for example, 13 to 26 V.

As shown in FIG. 4B, the negative voltage of −1 V is applied to the cell P-well during the data write and read operations in the present embodiment. Therefore, for example, the write voltage for acquiring similar write properties can be reduced by (Vpgm-1) V, that is, by the negative voltage applied to the cell P-well during the write operation, compared with the case where the voltage of 0 V is applied to the cell P-well.

Figure 5A:
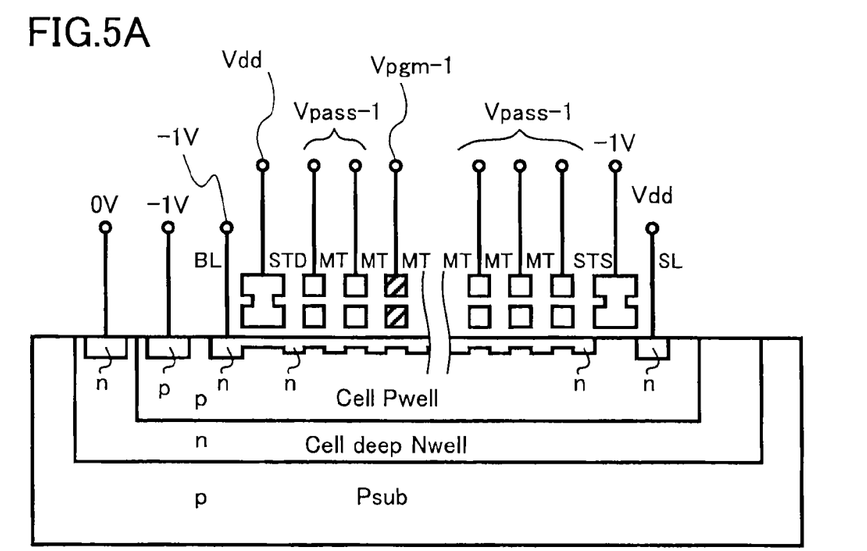
FIGS. 5A and 5B are schematic sectional views showing a potential relation during a write operation of the nonvolatile semiconductor memory device according to the first embodiment.
Figure 5B:
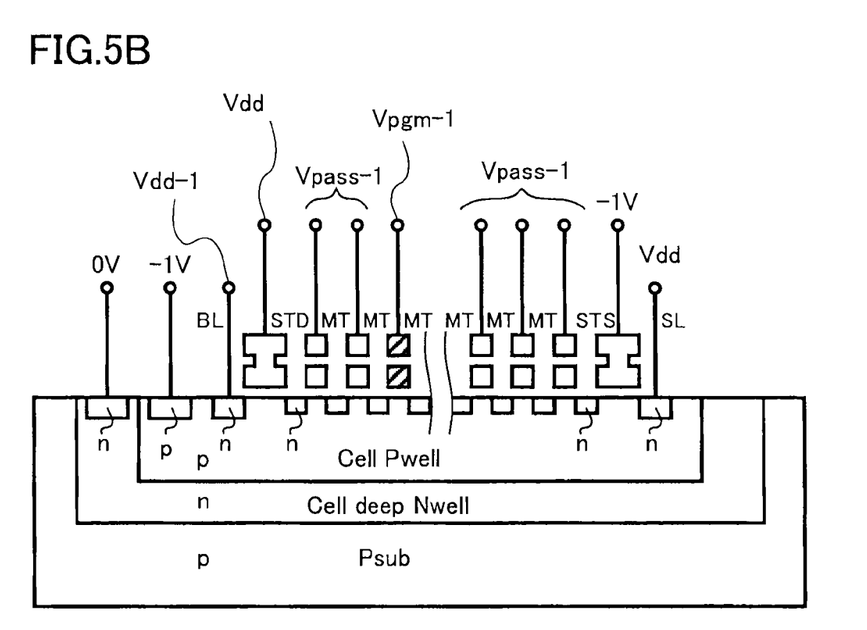

FIGS. 5A and 5B are schematic sectional views showing a potential relation during the write operation of the nonvolatile semiconductor memory device according to the present embodiment. FIGS. 5A and 5B show cross-sections in the vertical direction with respect to the word lines of the memory cell unit. FIG. 5A shows the cross-section of a selected bit line (BL) unit, and FIG. 5B shows the cross-section of a non-selected bit line (BL) unit.

Note that, to compare with the case where the voltage of 0 V is applied to the cell P-well, the voltages in the case where 0 V is applied to the cell P-well are represented as Vdd, Vpgm, and Vpass, as with FIGS. 4A and 4B. The potential relation in order to acquire similar write properties to the case where 0 V is applied to the cell P-well is shown.

In FIGS. 5A and 5B, memory cell transistors (MT) on a selected word line are shown with hatching. As shown in FIGS. 5A and 5B, a negative voltage of −1 V is applied to the cell P-well.

Further, the write voltage, that is, the voltage of (Vpgm-1) V is applied to the memory cell transistors (MT) on the selected word line during the write operation, where the write voltage is lower by the voltage applied to the cell P-well than that of the case where 0 V is applied to the cell P-well.

This is because, as shown in FIG. 5A, the negative voltage of −1 V can be applied to the selected bit line (BL) by causing the voltage of the cell P-well to be −1 V, so that a channel potential of the memory cell transistors MT during the write operation can be a negative voltage.

As described above, according to the present embodiment, the write voltage (program voltage Vpgm) during the data write operation can be reduced. Therefore, downsizing of the transistor of the word line switch unit 20 (FIGS. 1 and 2) becomes possible, where the write voltage (Vpgm) is applied to the source-drain of the transistor.

This is because the size of the transistor or the size between the transistors, for example, a gate length or an element separation length depends on the voltage applied to the source-drain of the transistor. For example, if a drain voltage decreases, the gate length for realizing similar cut-off properties can be shortened. Alternatively, if a source-drain voltage decreases, for example, an inter-element withstand voltage is improved, whereby the element separation length between adjacent transistors can be shortened. Accordingly, the area of the word line switch unit can be reduced, and the chip area of the nonvolatile semiconductor memory device can be reduced.

Further, the electric power consumption can be reduced by the reduction of the write voltage.

Further, the negative voltage to be provided to the selected bit line (BL) is generated in the second negative voltage generation unit 36 (FIG. 1). Further, the negative voltage generated in the second negative voltage generation unit 36 is transferred to the bit line by the bit line switch unit 14 (FIG. 1).

Note that, because the negative voltage is applied to the bit line, the p-type second P-well 104 on which the bit line connection unit 12 and the bit line switch unit 14 are formed is formed in the n-type second N-well 105 that electrically separates the second P-well 104 from the semiconductor substrate 101. That is, the bit line connection unit 12 and the bit line switch unit 14 are electrically separated from the semiconductor substrate 101 by being formed in a dual-well configured from the second P-well 104 and the second N-well 105.

Note that, from a viewpoint of acquiring similar write properties to the case where 0 V is applied to the cell P-well, it is desirable to apply −1 V to the gate electrode of the select gate transistor STS on the select gate line SGS, and to apply (Vpass-1) V to the control gate electrode of the memory cell transistors (MT) on the non-selected word line.

As shown in FIG. 5B, with respect to the non-selected bit line (BL), the select gate transistor STD is turned off because a back gate bias is applied thereto by providing (Vdd-1) V. Therefore, a voltage of a channel part of the memory cell transistor is boosted by self-boosting. Thus, no data is written in the memory cell transistors (MT) on the selected word line. In this way, the potential of the non-selected bit line (BL) can be also reduced by the voltage applied to the cell P-well. Therefore, the voltage applied to the bit line can be reduced compared with the case where 0 V is applied to the cell P-well.

If the voltage applied to the bit line decreases, reduction of the electric power consumption becomes possible. Further, the inter-element withstand voltage of the bit line connection unit 12 or of the sense amplifier unit can be improved, and the area of the bit line connection unit 12 or of the sense amplifier unit can be reduced.

Note that the voltage applied to the cell P-well is desirably −3 V or more and −1 V or less. If the voltage is lower than −3 V, there is a concern that a junction leakage between the well and a diffusion layer such as the source-drain of the transistor is increased, for example. On the other hand, if the voltage is higher than −1 V, there is a concern that an effective result of the reduction of the area cannot be obtained.

Figure 6:
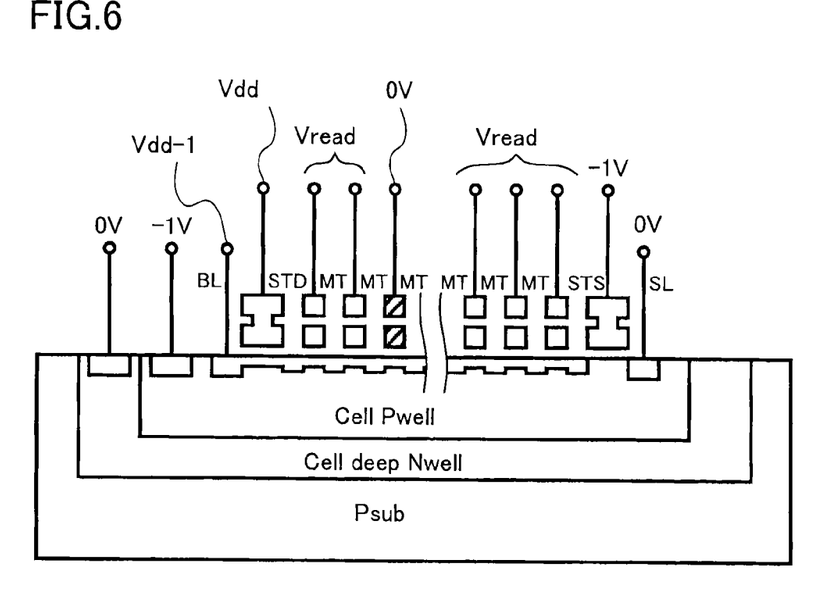
FIG. 6 is a schematic sectional view showing a potential relation during a read operation of the nonvolatile semiconductor memory device according to the first embodiment.

FIG. 6 is a schematic sectional view showing a potential relation during a read operation of the nonvolatile semiconductor memory device according to the present embodiment. FIG. 6 is a cross-section of the selected bit line (BL) unit, and shows the potential relation at the start of read operation. The memory cell transistors (MT) on the selected word line are shown with hatching.

Cut-off properties of the select gate transistor STS are improved, whereby data read properties are improved during the data read operation or the bit line precharge by applying the negative voltage of −1 V to the cell P-well, for example.

Figure 7:
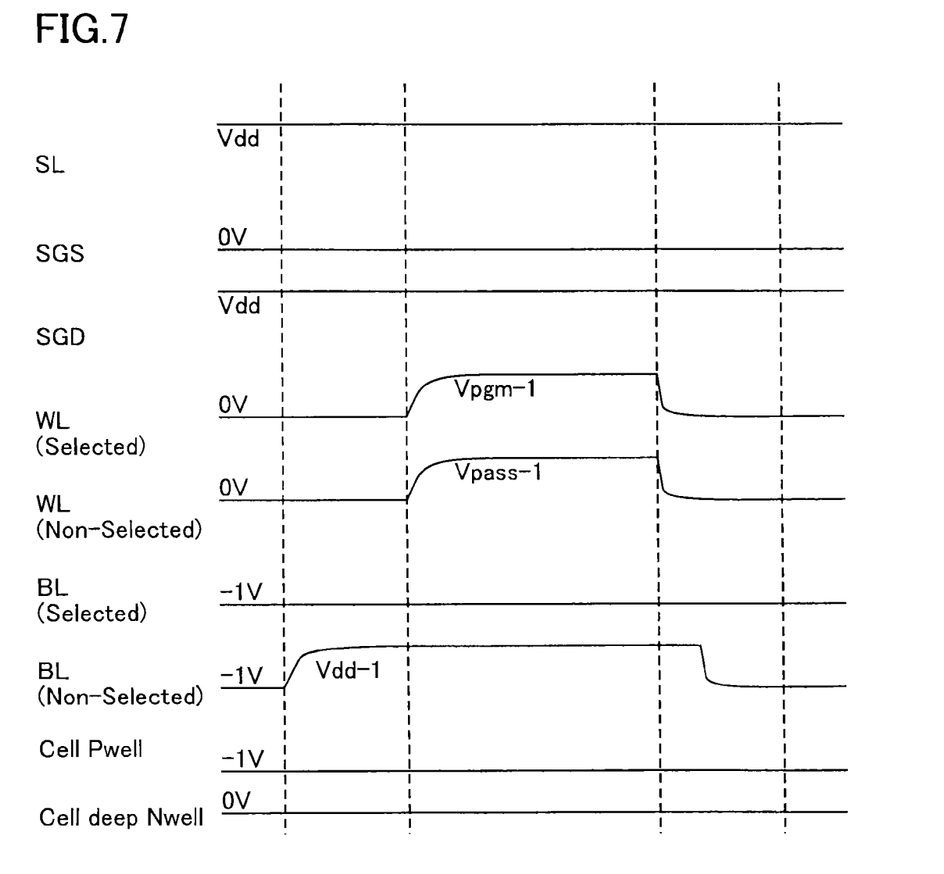
FIG. 7 is a timing chart of the nonvolatile semiconductor memory device during the write operation according to the first embodiment.

FIG. 7 is a timing chart of the nonvolatile semiconductor memory device during the write operation according to the present embodiment. As shown in the drawing, a voltage of the non-selected bit line is boosted to (Vdd-1) V, and the cell P-well is put in a condition of being applied −1 V as a negative voltage before the write operation is started. Then, data is written to selected memory cells by applying (Vpgm-1) V to the selected word line and (Vpass-1) V to the non-selected word line.

Note that, from a viewpoint of reducing the electric power consumption for charging-discharging the cell P-well, it is desired to maintain the condition where the negative voltage is applied to the cell P-well during the operations except the data erase operation, that is, during the data write and read operations, and during stand-by (waiting operation). Stand-by is a time period waiting for the data erase, write or read operation. Therefore, it is desired for the voltage applied to the cell P-well at the start and end of the data erase operation to be a negative voltage. For example, in a case where an erase loop is one cycle, the voltage applied to the cell P-well changes from the negative voltage to a positive voltage, and from the positive voltage to a negative voltage in sequence.

As described above, according to the nonvolatile semiconductor memory device of the present embodiment, reduction of the write voltage during the data write operation to the memory cells is realized. Therefore, reduction of the area of the word line switch unit or the bit line connection unit becomes possible. Accordingly, reduction of the chip area becomes possible.

(Second Embodiment)

A nonvolatile semiconductor memory device according to the present embodiment further includes a fourth negative voltage generation unit for applying a negative voltage to a word line of memory cell transistors of a memory cell unit, and is similar to the first embodiment except that a word line switch unit is formed on a p-type third P-well surrounded by an n-type third N-well. Therefore, description of the contents that overlap with the first embodiment is omitted.

Figure 8:
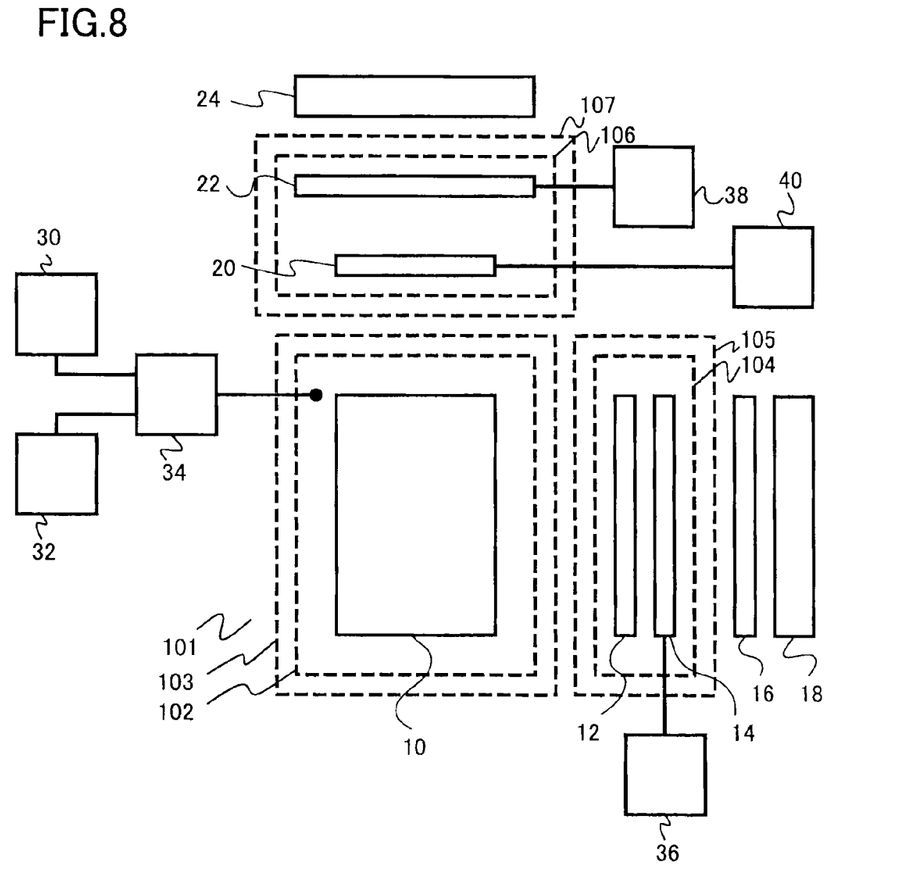
FIG. 8 is a block diagram of a nonvolatile semiconductor memory device according to a second embodiment.

FIG. 8 is a block diagram of the nonvolatile semiconductor memory device of the present embodiment.

The nonvolatile semiconductor memory device of the present embodiment includes a fourth negative voltage generation unit 40 for applying a negative voltage to a word line of memory cell transistors of a memory cell unit. The negative voltage generated in the fourth negative voltage generation unit 40 is transferred to the word line of the memory cell transistors by a word line switch unit 20.

The word line switch unit 20 is formed on a p-type third P-well 106. Further, the third P-well 106 is surrounded by an n-type third N-well 107 that electrically separates the third P-well 106 from a semiconductor substrate 101.

In this way, the word line switch unit 20 is formed within a dual well, thereby being electrically separated from the semiconductor substrate 101. Therefore, it becomes possible to apply the negative voltage generated in the fourth negative voltage generation unit 40 to a source-drain of a transistor of the word line switch unit 20.

Figure 9:
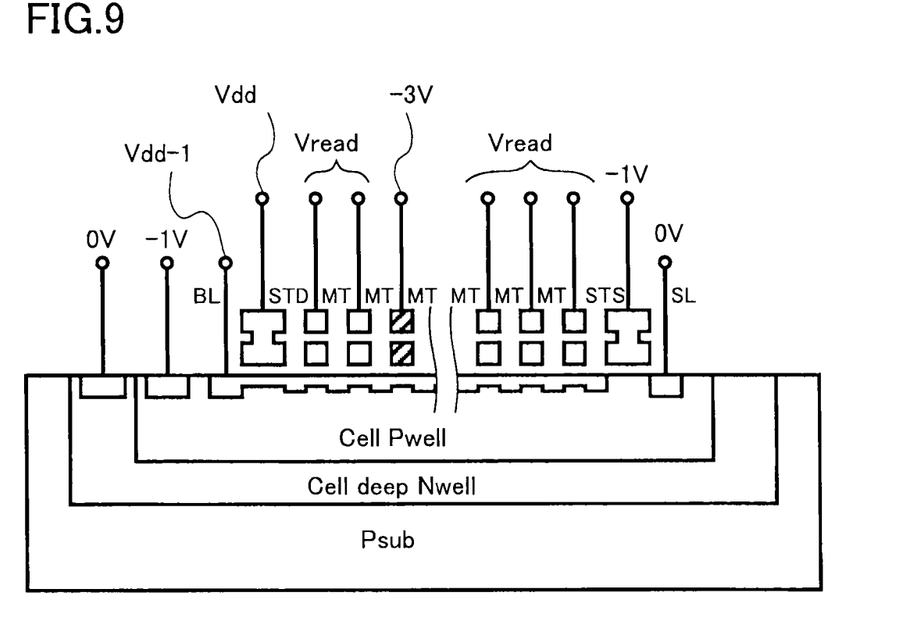
FIG. 9 is a schematic sectional view showing a potential relation of the nonvolatile semiconductor memory device during a read operation according to the second embodiment.

FIG. 9 is a schematic sectional view showing a potential relation of the nonvolatile semiconductor memory device during a read operation according to the present embodiment. FIG. 9 is a cross-section of a selected bit line (BL) unit, and shows the potential relation at the start of read. Memory cell transistors (MT) on a selected word line are shown with hatching.

The negative voltage of, for example, −3 V generated in the fourth negative voltage generation unit 40 can be applied to the selected word line via the word line switch unit 20. Therefore, data read margin can be improved depending on a level of data written to a cell by applying the negative voltage to the word line.

Note that the voltage applied to the word line is desirably −3 V or more and −1 V or less. If the voltage is lower than −3 V, there is a concern that a junction leakage in the word line switch unit 20 is increased, for example. On the other hand, if the voltage is higher than −1 V, there is a concern that sufficient improvement of the data read margin cannot be acquired.

Further, from a viewpoint of acquiring the sufficient data read margin, it is desired that the negative voltage lower than that of the cell P-well be applied to the selected word line.

As described above, according to the present embodiment, the effect of improving the data read margin can be acquired in addition to the effect of the first embodiment.

Although the first to fourth negative voltage generation units are described as being independent of each other, a part or the whole of the negative voltage generation units can be a common negative voltage generation circuit.

While certain embodiments have been described, these embodiments have been presented by way of example only, and are not intended to limit the scope of the inventions. Indeed, the nonvolatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a p-type semiconductor substrate;
   a first P-well formed in the semiconductor substrate, a plurality of memory cells being formed on the first P-well; and
   a first N-well surrounding the first P-well, the first N-well electrically separating the first P-well from the semiconductor substrate,
   wherein a positive voltage is applied to the first P-well during a data erase operation of the memory cells, and
   a negative voltage is applied to the first P-well during a data write operation and a data read operation of the memory cells.

2. The device according to claim 1, wherein a voltage applied to the first P-well starts with a negative voltage and ends with a negative voltage during the data erase operation.

3. The device according to claim 1, wherein the negative voltage applied to the first P-well is −3 V or more and −1 V or less.

4. The device according to claim 1, wherein the positive voltage applied to the first P-well is 13 V or more and 26 V or less.

5. The device according to claim 1, wherein a negative voltage is applied to a selected bit line during the data write operation of the memory cells.

6. The device according to claim 5, wherein a negative voltage is applied to a selected word line during the data read operation of the memory cells.

7. The device according to claim 1, wherein a negative voltage is applied to a selected word line during the data read operation of the memory cells.

8. The device according to claim 1, wherein a negative voltage is applied to the first P-well during stand-by for the data erase operation, the data write operation or the data read operation.

9. The device according to claim 1, wherein a voltage applied to the first P-well changes from a negative voltage to a positive voltage and from the positive voltage to the negative voltage in sequence, during one cycle of an erase loop in the data erase operation.

10. A nonvolatile semiconductor memory device comprising:
    a p-type semiconductor layer;
    a first P-type region formed in the semiconductor layer, a plurality of memory cells being formed on the first P-type region; and
    a first N-type region contacting the first P-type region, the first N-type region electrically separating the first P-type region from the semiconductor layer,
    wherein a positive voltage is applied to the first P-type region during a data erase operation of the memory cells, and
    a negative voltage is applied to the first P-type region during a data write operation and a data read operation of the memory cells.

11. The device according to claim 10, wherein a voltage applied to the first P-type region starts with a negative voltage and ends with a negative voltage during the data erase operation.

12. The device according to claim 10, wherein the negative voltage applied to the first P-type region is −3 V or more and −1 V or less.

13. The device according to claim 10, wherein the positive voltage applied to the first P-well is 13 V or more and 26 V or less.

14. The device according to claim 10, wherein a negative voltage is applied to a selected bit line during the data write operation of the memory cells.

15. The device according to claim 14, wherein a negative voltage is applied to a selected word line during the data read operation of the memory cells.

16. The device according to claim 10, wherein a negative voltage is applied to a selected word line during the data read operation of the memory cells.

17. The device according to claim 10, wherein a negative voltage is applied to the first P-type region during stand-by for the data erase operation, the data write operation or the data read operation.

18. The device according to claim 10, wherein a voltage applied to the first P-type region changes from a negative voltage to a positive voltage and from the positive voltage to the negative voltage in sequence, during one cycle of an erase loop in the data erase operation.

* * * * *